(12) United States Patent
Lee

(10) Patent No.: US 7,316,952 B2
(45) Date of Patent: *Jan. 8, 2008

(54) METHOD FOR FORMING A MEMORY DEVICE WITH A RECESSED GATE

(75) Inventor: Pei-Ing Lee, Changhua County (TW)

(73) Assignee: Nanya Technology Corporation, Taoyuan (TW)

( * ) Notice: Subject to any disclaimer, the term of this patent is extended or adjusted under 35 U.S.C. 154(b) by 332 days.

This patent is subject to a terminal disclaimer.

(21) Appl. No.: 11/141,656

(22) Filed: May 31, 2005

(65) Prior Publication Data

US 2006/0270149 A1    Nov. 30, 2006

(51) Int. Cl.
*H01L 21/8242* (2006.01)

(52) U.S. Cl. .............. 438/243; 438/270; 438/589; 257/E21.652

(58) Field of Classification Search ......... 257/E21.652
See application file for complete search history.

(56) References Cited

U.S. PATENT DOCUMENTS

| | | | |
|---|---|---|---|
| 6,331,459 B1 | 12/2001 | Gruening | |
| 6,707,095 B1 | 3/2004 | Chidambarrao et al. | |
| 7,015,092 B2 | 3/2006 | Jaiprakash et al. | |
| 7,164,170 B2 * | 1/2007 | Kim ........................... | 257/330 |
| 2002/0105019 A1 * | 8/2002 | Mandelman et al. ....... | 257/296 |
| 2004/0036100 A1 * | 2/2004 | Divakaruni et al. ........ | 257/301 |
| 2004/0238869 A1 * | 12/2004 | Chang et al. ............... | 257/301 |
| 2005/0054157 A1 | 3/2005 | Hsu | |
| 2005/0067648 A1 | 3/2005 | Hung et al. | |
| 2006/0228861 A1 | 10/2006 | Kang et al. | |
| 2006/0258109 A1 | 11/2006 | Juengling | |
| 2006/0270176 A1 * | 11/2006 | Lee et al. ................... | 438/386 |

* cited by examiner

*Primary Examiner*—Stephen W. Smoot
(74) *Attorney, Agent, or Firm*—Quintero Law Office

(57) ABSTRACT

A method for forming a semiconductor device. A substrate, having a plurality of deep trench capacitors therein, is provided wherein upper portions of the deep trench capacitor devices are revealed. Spacers on sidewalls of the upper portions of the deep trench capacitors are formed to form a predetermined region surrounded by the deep trench capacitor devices. The predetermined region of the substrate is etched using the spacers and the upper portions of the deep trench capacitors serve as a mask to form a recess, and a recessed gate is formed in the recess.

16 Claims, 10 Drawing Sheets

METHOD FOR FORMING A MEMORY DEVICE WITH A RECESSED GATE

BACKGROUND

The present invention relates in general to a method of fabricating a memory device, and more particularly, to a method of fabricating a memory device with a recessed gate.

In the rapidly evolving integrated circuit industry there is a development tendency toward high performance, miniaturization, and high operating speed. Additionally dynamic random access memory (DRAM) fabrication methods have developed rapidly.

Typically, current dynamic random access memory DRAM cells include a transistor and a capacitor. Since the capacity of current DRAM has reached 256 MB and up to 512 MB, the size of memory cells and transistors has narrowed to meet demands for high integration, higher memory capacity and higher operating speeds. In conventional planar transistor technology, however, more useable surface area on a chip is required, and it is difficult to meet the previously mentioned demands. Accordingly, recessed gate and channel technology has been applied to DRAM fabrication with the goal of reducing the area occupied by the transistor and the capacitor on the semiconductor substrate. The conventional planar transistor technology requires a large amount of surface area on the chip, and cannot accomplish the demand for high integration. Conversely the disadvantages of the conventional semiconductor memory cell can be improved by applying recessed vertical gate transistor RVERT technology to DRAM fabrication. And the RVERT technology is positioned to become a major semiconductor memory cell fabrication method.

FIG. 1 is a top view of conventional vertical gate transistor. Referring to FIG. 1, a distance between a recessed gate and a deep trench capacitor 104 requires to precise control due to the requirement for controlling out diffusion distance D. The overlay control of forming recessed gate in conventional lithography process, however, is very tight when process generation is 60 nm or further.

SUMMARY

These and other problems are generally solved or circumvented, and technical advantages are generally achieved, by preferred illustrative embodiments of the present invention, which provide a method for forming a memory device.

An embodiment of the invention provides a method for forming a semiconductor device. A substrate, comprising at least two deep trench capacitors therein is provided, wherein upper portions of the deep trench capacitor devices are revealed. Spacers on sidewalls of the upper portions of the deep trench capacitors are formed. The substrate is etched using the upper portions of the deep trench capacitors and the spacers as a mask to form a recess, and a recessed gate is formed in the recess.

An embodiment of the invention provides a method for forming a semiconductor device. A substrate, having a plurality of deep trench capacitors therein, is provided wherein upper portions of the deep trench capacitor devices are revealed. Spacers on sidewalls of the upper portions of the deep trench capacitors are formed to form a predetermined region surrounded by the deep trench capacitor devices. The predetermined region of the substrate is etched using the spacers and the upper portions of the deep trench capacitors serve as a mask to form a recess, and a recessed gate is formed in the recess.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
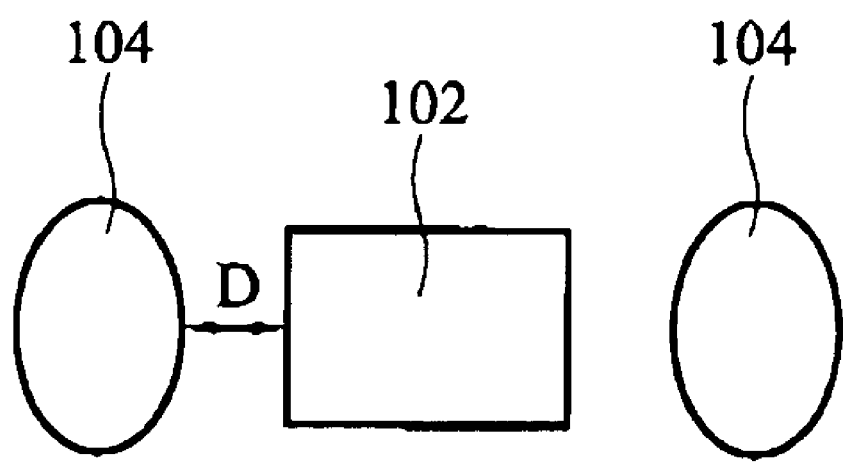
FIG. 1 is a top view of conventional vertical gate transistor.

Embodiments of the invention, which provides a method for forming a semiconductor device, will be described in greater detail by referring to the drawings that accompany the invention. It is noted that in the accompanying drawings, like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more laminated layers.

Figure 2A:
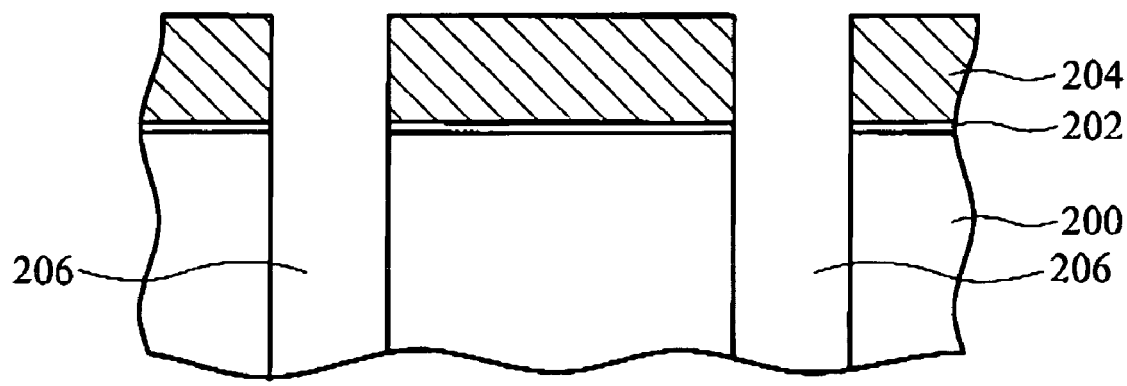
FIG. 2A~FIG. 2G illustrate process steps for forming a memory with a recessed vertical transistor of an embodiment of the invention.
Figure 2B:
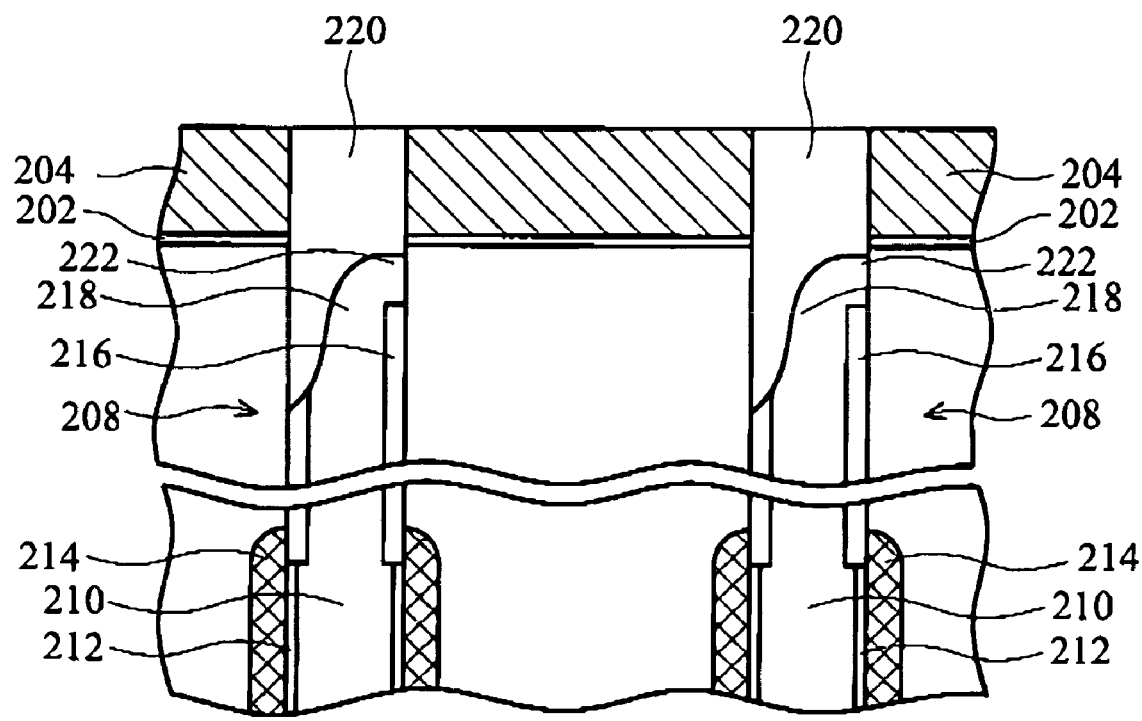

FIG. 2A~FIG. 2G illustrate process steps for forming a memory with a recessed vertical transistor of an embodiment of the invention. Referring to FIG. 2A, a substrate 200 is provided, and a first pad layer 202 and a second pad layer 204 are disposed on the substrate 200. The substrate 200 may comprise silicon, gallium arsenide, gallium nitride, strained silicon, silicon germanium, silicon carbide, diamond, an epitaxy layer, and/or other materials. The first pad layer 202 may comprise silicon oxide, the second pad layer 204 may comprise silicon nitride, both patterned by conventional lithography and then etched to form at least two openings. Next, the substrate 200 is etched to form at least two trenches 206 using the patterned first pad layer 202 and second pad layer 204 as a hard mask. As shown in FIG. 2B, deep trench capacitors 208 are formed in the trenches. Lower portion of a deep trench capacitor 208 comprises a top electrode 210, such as polysilicon, a capacitor dielectric layer 212, such as ONO, and a bottom electrode 214 is a doped region in the substrate 200 adjacent. Upper portion of a deep trench capacitor 208 comprises a collar dielectric layer 216, a conductive layer 218 electrically connected to the top electrode 212, and a single side insulating layer 220 disposed at the top, isolating one side and exposing the other side to form a buried strap 222. In an embodiment of the invention, top surface of the single side insulating layer 220 is substantially the same level as the second pad layer 204.

Figure 2C:
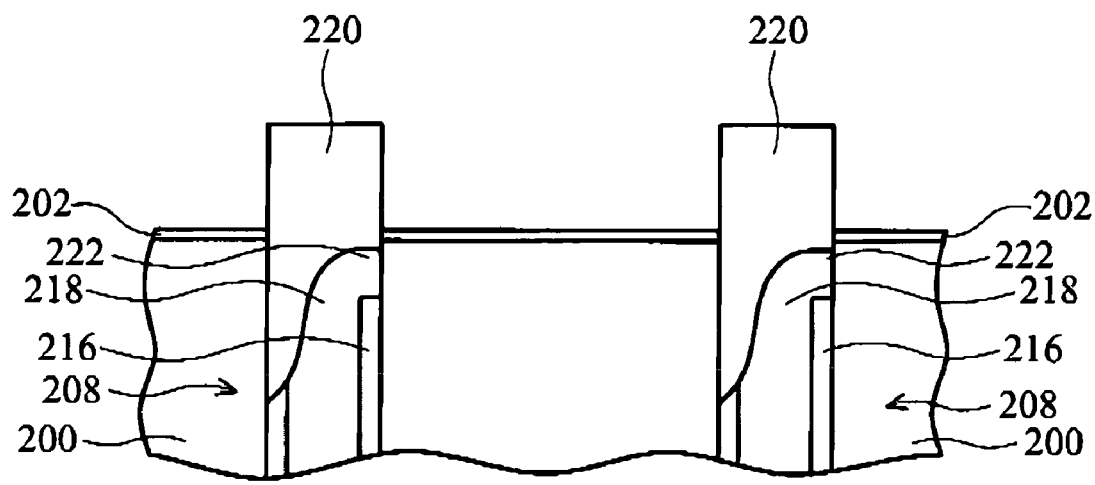
Figure 2D:
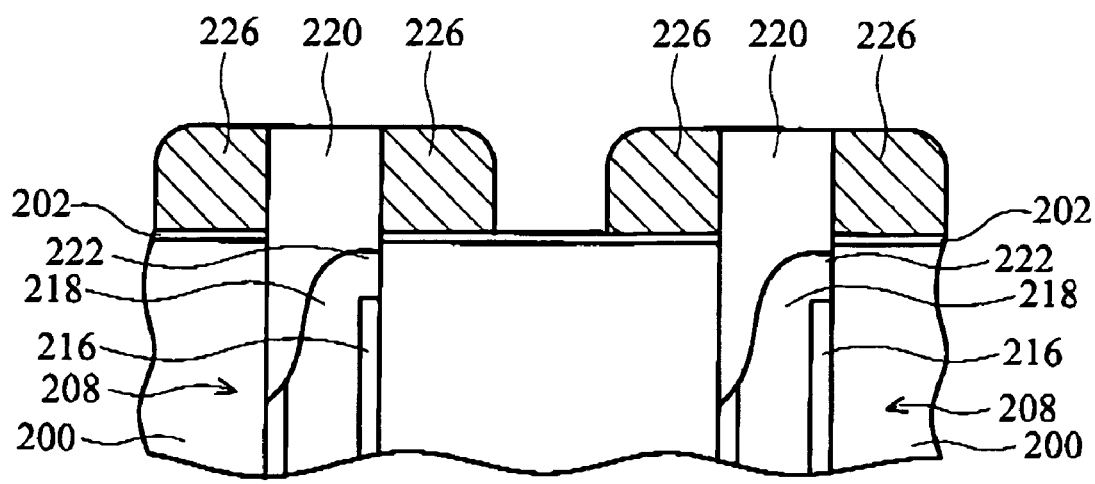

Next, referring to FIG. 2C, the second pad layer is removed using selective etching to reveal a portion of the deep trench capacitors 208. Preferably, subsequent to the described removal step, a portion of the deep trench capacitors 208 protrude above the substrate 200 surface level. For example, when the first pad layer 202 and the single side insulating layer 220 are silicon oxide, removal of the second pad layer can be accomplished by immersion in phosphoric acid. Referring to FIG. 2D, a spacer layer (not shown) is formed on the first pad layer 202 and the single side insulating layer 220 by deposition. The spacer layer can be silicon nitride, silicon oxide, silicon oxynitride, a combination thereof, a stack layer thereof, polyimide, SOG, low K dielectric layer, such as FSG, Black Diamond, SILK.™, FLARE.™, LKD, Xerogel, or Aerogel, or other material. Preferably, the spacer layer comprises silicon nitride.

Figure 2E:
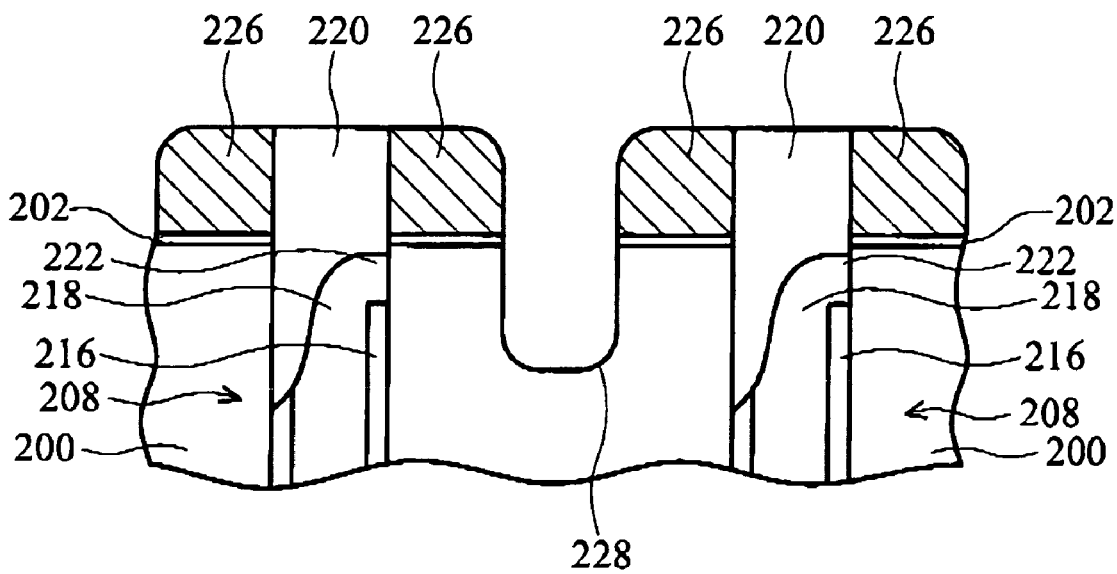

Next, the spacer layer is etched to form spacers 226 on sidewalls of the revealed portions of the deep trench capacitors 208. In the preferred embodiment of the invention, the etching step is anisotropic etching, which can use $CHF_3$, a combination of $CF_4$ and O2, or a combination of $C_2F_6$ as the main etchant, and can also be further enhanced with plasma when the spacers 226 are silicon nitride. When the spacers 226 are silicon oxide, the anisotropic etching can use $CHF_3$, a combination of $CF_4$ and $O_2$, a combination of $CF_4$, or $C_2F_6$ or $C_3F_8$ as the main etchant, and can also be further enhanced with plasma. The width and height of the spacers 226 can affect channel length, source width and drain width, and can be well controlled by fine tuning process parameters, such as etching pressure, temperature, power, bias, gas flow. Referring to FIG. 2E, the first pad layer 202 is etched using the spacers 226 and single side isolation 220 of the deep trench capacitors 208 as an etching mask. Next, the substrate 200 is further etched by anisotropic etching, such as reactive ion etching, to form a recess 228 between the deep trench capacitors 208 using the spacers 226, the single side isolation 220 of the deep trench capacitors 208 and the patterned first rad layer 202 as an etching mask.

Figure 2F:
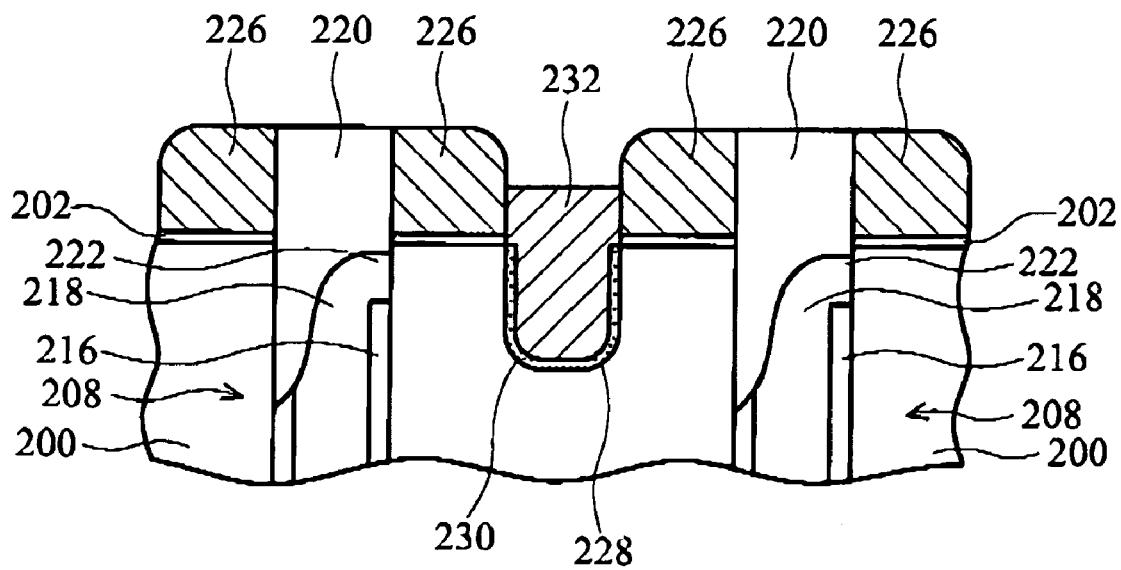

Next, referring to FIG. 2F, a gate dielectric layer 230, preferably silicon oxide, is formed on the bottom and sidewall of the recess 228. The gate dielectric layer 228 can be formed using a thermal process or a deposition process. The thermal process can be rapid thermal oxidation, furnace oxidation or in situ steam generation ISSG. The deposition process can be low pressure chemical vapor deposition LPCVD, high temperature oxide (HTP) deposition and the like.

Thereafter, a conductive material, such as polysilicon, tungsten or tungsten silicide or similar is filled into the recess by deposition, such as low pressure chemical phase deposition LPCVD. The conductive material is then etched back to form a recessed gate 232, a top surface of which can be at the same level as the single side isolating layer 220 or lower.

Figure 2G:
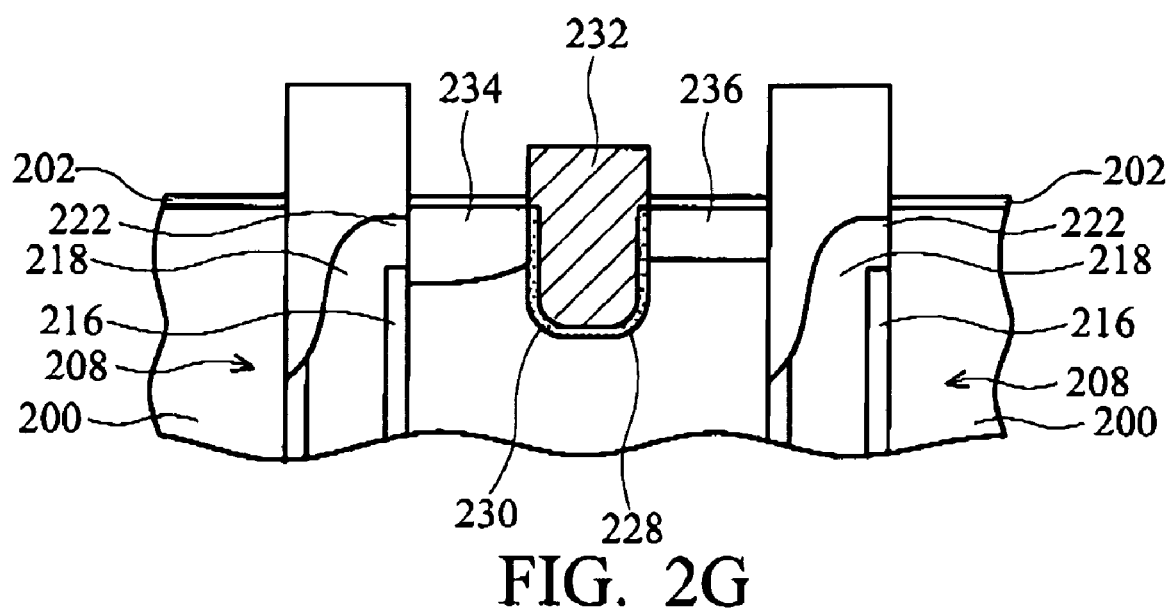

Referring to FIG. 2G, the spacers 226 are removed by wet etching, such as immersion in phosphoric acid. Next, the substrate 200 is ion implanted to form a source region 234 and a drain region 236 on opposite sides of the recessed gate 232, wherein the source region 234 electrically connects the conductive layers of the deep trench capacitor at the buried strap region 222.

According to the embodiment described, one photolithography step may be omitted when forming the recessed gate, thus reducing cost. Further, due to self-alignment of the recessed gate with spacers instead of photolithography, a length between RVERT and deep trench capacitors may be precisely controlled, and out diffusion distance therebetween may be controlled more easily.

Figure 3A:
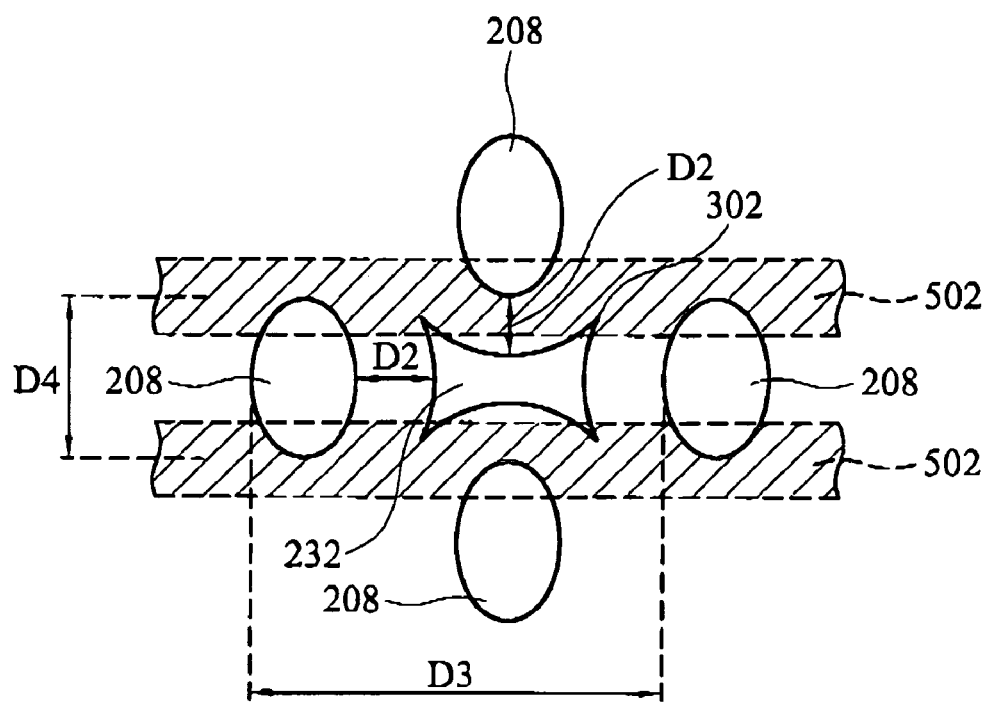
FIG. 3A is a top view of a memory with a recessed vertical transistor of an elementary example of the invention.
Figure 3B:
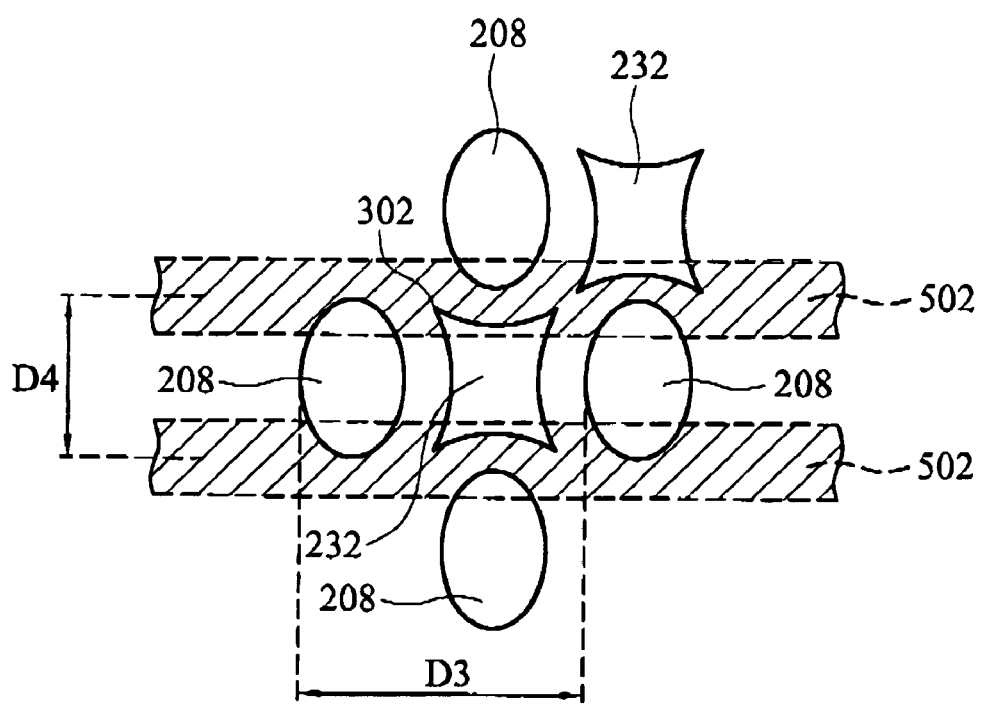
FIG. 3B is a top view of a memory with a recessed vertical transistor of an elementary example of the invention, wherein the cell size is 6F2.
Figure 3C:
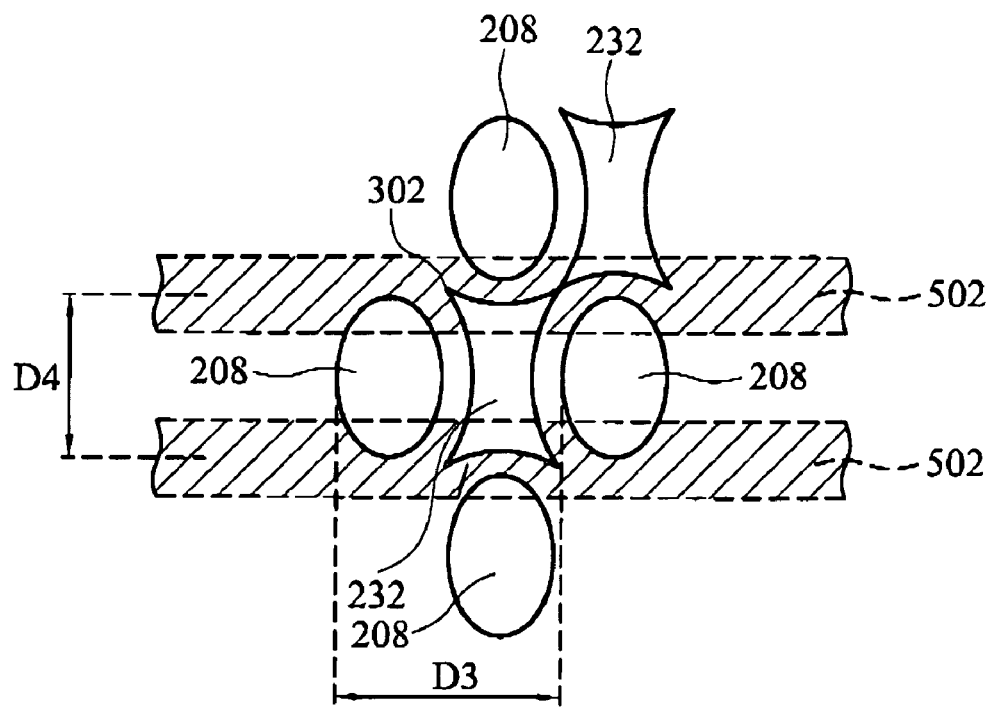
FIG. 3C is a top view of a memory with a recessed vertical transistor of an elementary example of the invention, wherein the cell size is 4F2.
Figure 3D:
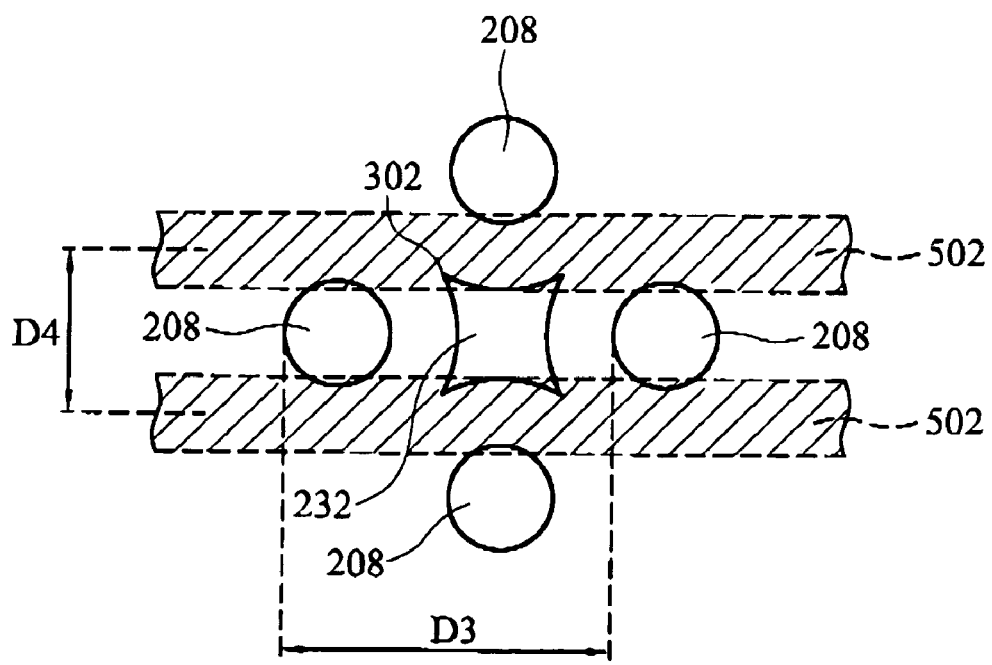
FIG. 3D is a top view of a memory with a recessed vertical transistor of an elementary example of the invention, wherein the cell size is 4.5F2.
Figure 4A:
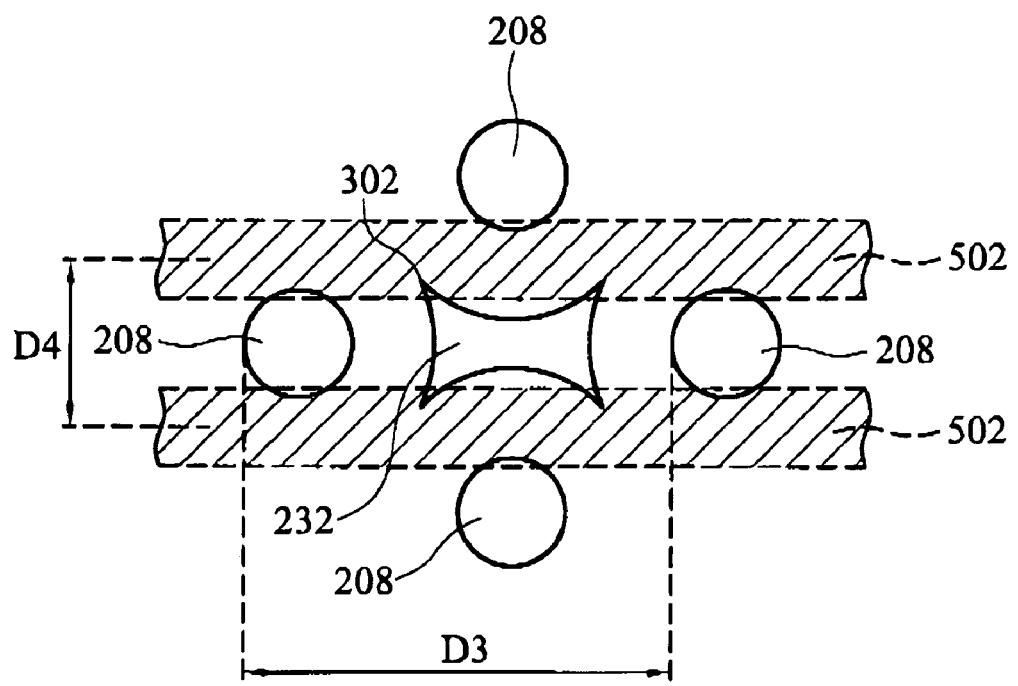
FIG. 4A is a top view of a memory with a recessed vertical transistor of another elementary example of the invention.
Figure 4B:
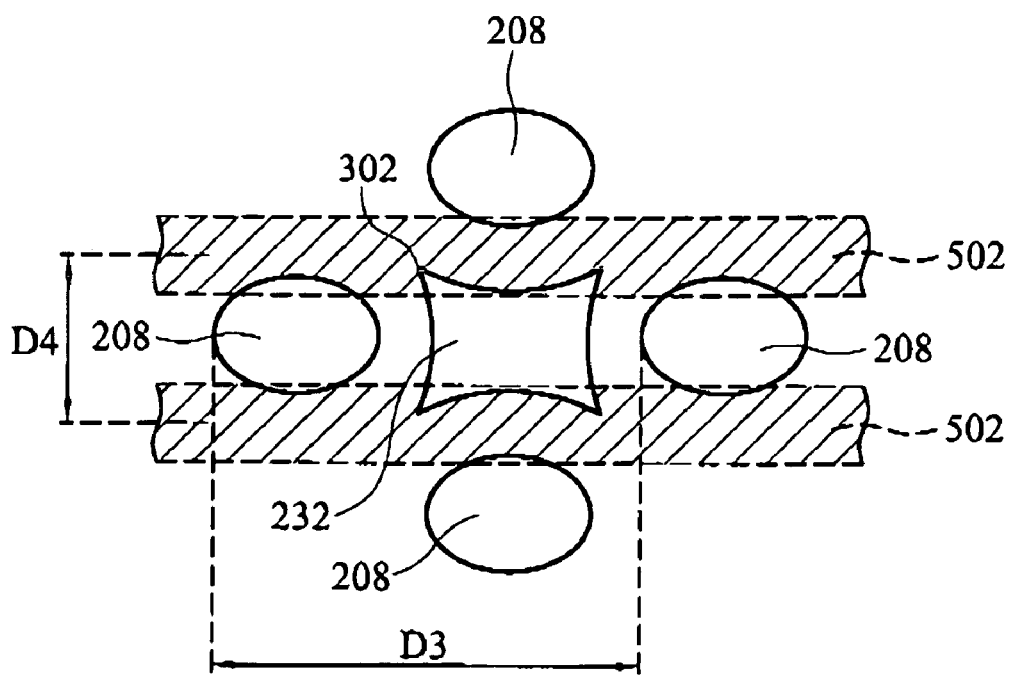
FIG. 4B is a top view of a memory with a recessed vertical transistor of further another elementary example of the invention.

FIG. 3A is a top :view of a memory with a recessed vertical transistor of an elementary example of the invention. The cell size is 8F2, in which horizontal length D3 is 4F and vertical length D4 is 2F. As shown in FIG. 3A, the region 302 predetermined to form a recessed gate is surrounded by four deep trench capacitors 208. In a preferred embodiment of the invention, the deep trench capacitors 208 are arranged in a matrix and have substantially the same distance D2 from deep trench capacitors 208 to the region 302.

Further, the deep trench capacitors 208 protrude above the substrate 200 surface level for a height. When the spacers are formed on sidewalls of the protruded portion of the deep trench capacitor 208, the substrate 200 is covered beyond the predetermined recess gate region 302. Consequently, the recess gate 232 can be defined by the spacers formed on sidewalls of the protruded portion of the deep trench capacitor 208 surrounding the predetermined recess gate region 302. Next, an etching process can be preceded to form a recess at the predetermined recess gate region 302 using the spacers and the deep trench capacitor 208 as a mask. Thereafter, a gate dielectric layer and a recessed gate are formed in the recess. Subsequent to formation of the deep trench capacitors 208 and the recessed gate 232, shallow trench isolations 502 are formed in the substrate 200 to define active areas.

Due to definition of the recessed gate 232 by spacers instead of photo-lithography, out diffusion distance D can be controlled precisely without overlap problem. The recessed gate 232 can be precisely defined at a middle portion between two adjacent deep trench capacitors 208. Consequently, device shrinkage can be achieved along word line orientation or bit line orientation. For example, shrinkage along word line to achieve 6F2 cell size is able to be achieved, in which horizontal length D3 is 3F and vertical length D4 is 2F, as shown in 3B. Further, shrinkage along word line orientation to achieve 4F2 cell size can also be achieved, in which horizontal length D3 is 2P and vertical length D4 is 2F, as shown in 3C. Furthermore, shrinkage along word line and bit line orientation to achieve 4.5F2 cell size can be achieved, in which horizontal length D3 is 3F and vertical length D4 is 1.5F, as shown in 3D. In addition, shrinkage along bit line orientation to achieve 6F2 cell size and the deep trench capacitor is round shape can be achieved, in which horizontal length D3 is 3F and vertical length D4 is 2F, as shown in 4A. Shrinkage along bit line orientation to achieve 6F2 cell size and the deep trench capacitor is oval-shape can be achieved, in which horizontal length D3 is 3F and vertical length D4 is 2F, as shown in 4B.

Figure 5A:
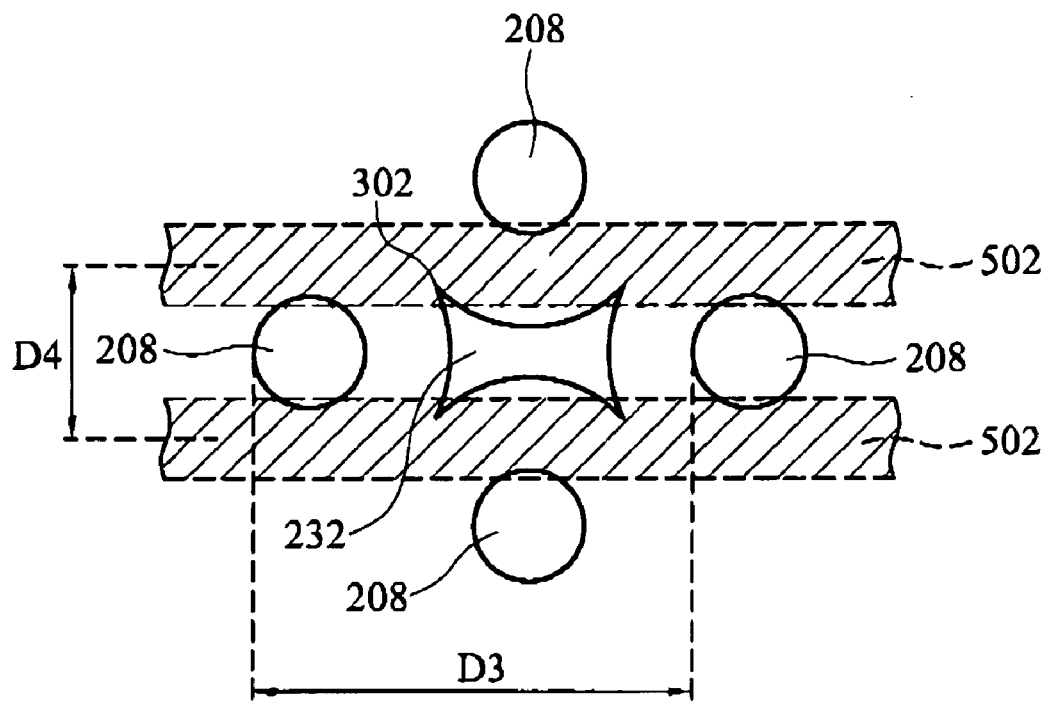
FIG. 5A is a top view of a memory with a recessed vertical transistor of yet another elementary example of the invention.
Figure 5B:
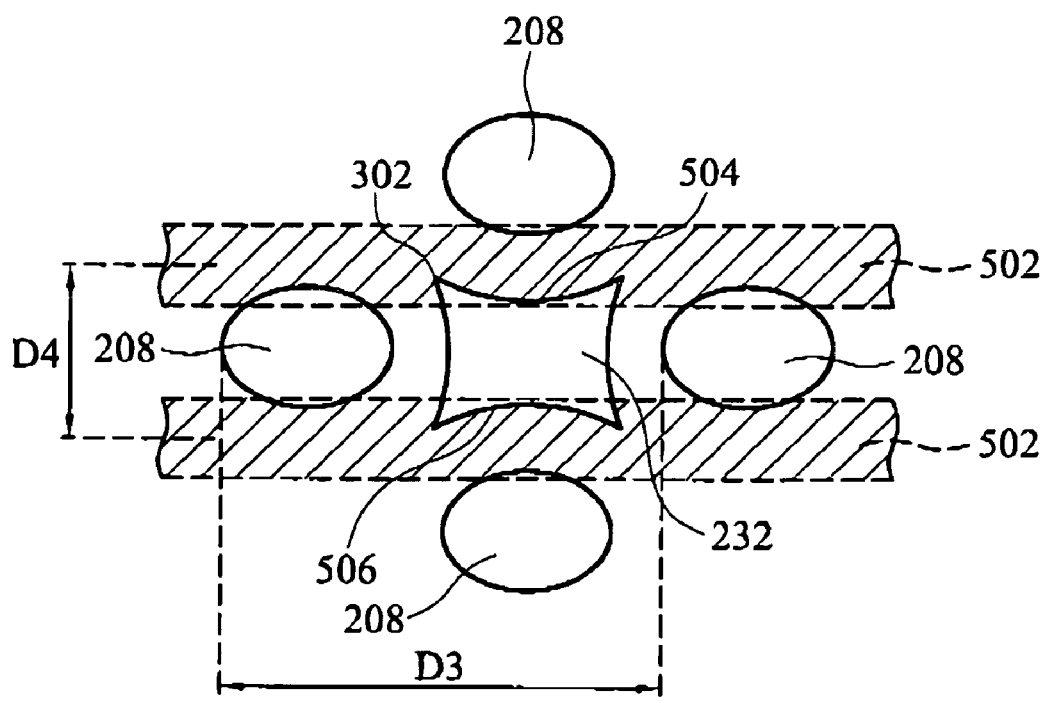
FIG. 5B is a top view of a memory with a recessed vertical transistor of yet further another elementary example of the invention.

Referring to FIG. 5A, in an embodiment of the invention, shallow trench isolation 502 for defining an active area comprising the recessed gate 232 can only cut four corners of the recessed gate 232 to active a larger isolation process window, or cut an upper portion 504 and a lower portion 506 of the recess gate 232 to have a better isolation effect, as shown in FIG. 5B.

Figure 5C:
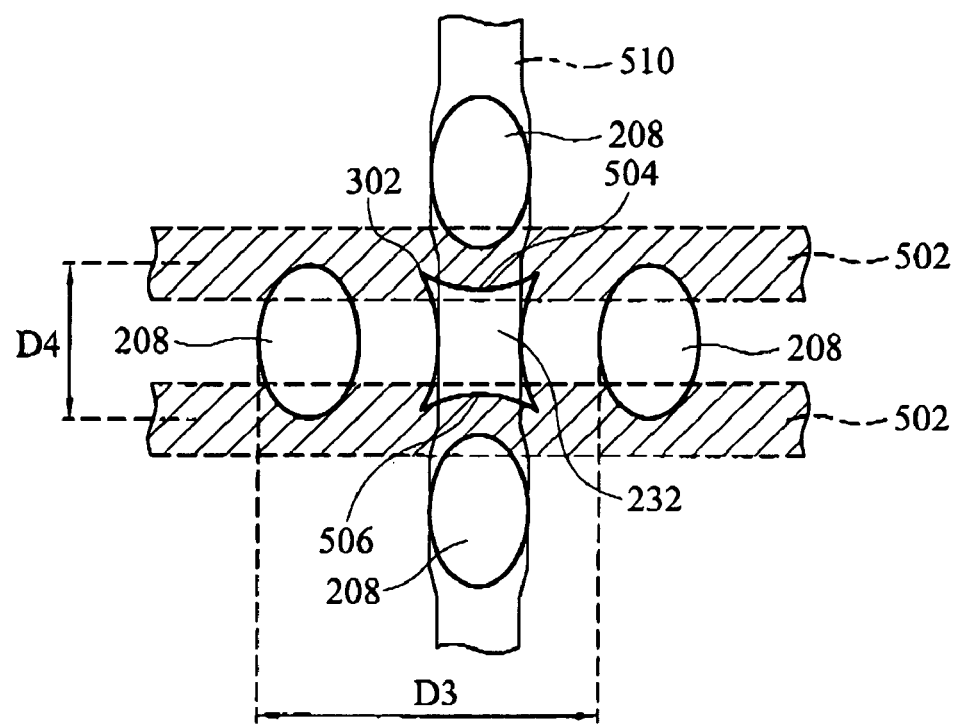
FIG. 5C is a top view of a memory with a recessed vertical transistor comprising word lines of an elementary example of the invention.
Figure 5D:
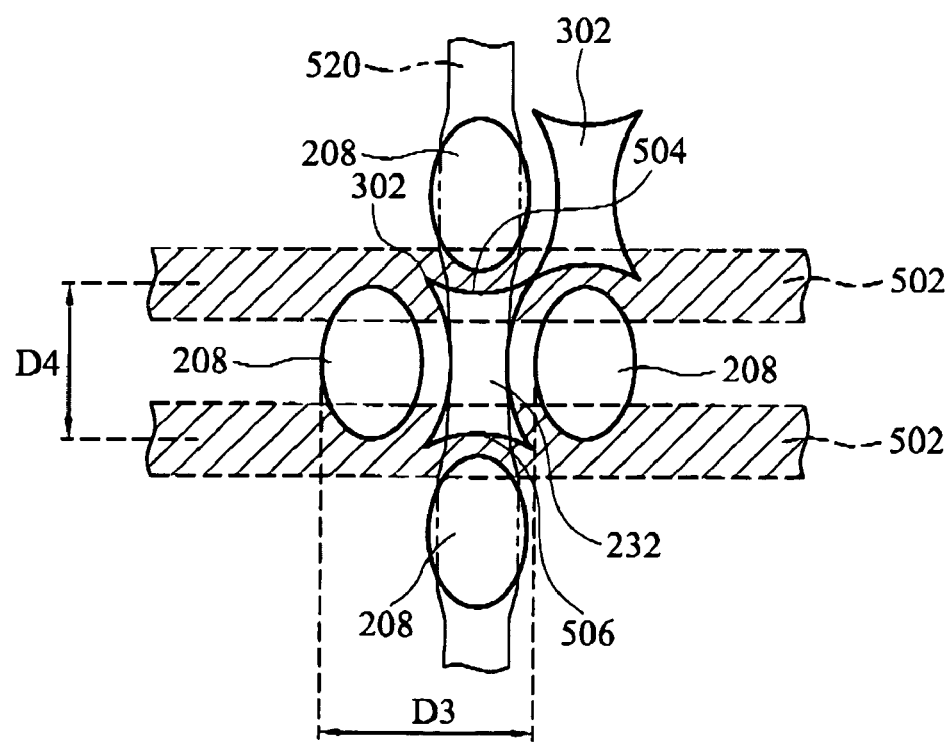
FIG. 5D is a top view of a memory with a recessed vertical transistor comprising word lines of another elementary example of the invention.

In an embodiment of the invention, word lines are subsequently formed. Consequently, the word lines are not required to be straight lines with constant width. For example, as shown in FIG. 5C, the word lines 510 can have a wider portion overlying the deep trench capacitors 208 and a narrow portion overlying the recessed gate 232. In another embodiment of the invention, the word line 520 can only overlap a central portion of the deep trench capacitors 208, as shown in FIG. 5D.

According to the described embodiment, one photolithography step may be omitted when forming the recess gate, thus reducing cost. Further, due to self-alignment of the recessed gate with spacers instead of photolithography, a length between recessed vertical transistor RVERT and deep trench capacitor DT may be controlled precisely, the recessed gate may be defined precisely at right middle of the two adjacent deep trench capacitors, overlap problem may be eliminated, critical dimension can be precisely controlled and out diffusion distance between the deep trench capacitor and the recessed gate may be easily controlled more.

While the invention has been described by way of example and in terms of the preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
    providing a substrate, comprising at least two deep trench capacitors therein, wherein upper portions of the deep trench capacitor devices are revealed;
    forming spacers on sidewalls of the upper portions of the deep trench capacitors;
    etching the substrate using the upper portions of the deep trench capacitors and the spacers as a mask to form a recess; and
    forming a recessed gate in the recess.

2. The method for forming a semiconductor device as claimed in claim 1, wherein the step of providing a substrate, comprising at least two deep trench capacitor devices therein, wherein upper portions of the deep trench capacitor devices are revealed comprises:
    providing a substrate with a pad layer formed thereon;
    patterning the pad layer and the substrate to form at least two trenches;
    forming a deep trench capacitor device in each trench; and
    removing the pad layer until upper portions of the deep trench capacitor devices are revealed.

3. The method for forming a semiconductor device as claimed in claim 2, wherein the pad layer comprises a pad nitride layer and a pad oxide layer.

4. The method for forming a semiconductor device as claimed in claim 1, wherein top surface of the recessed gate is at substantially the same level as deep trench capacitor device.

5. The method for forming a semiconductor device as claimed in claim 1, further comprising implanting the substrate to form a source region and a drain region on opposite sides of the recessed gate.

6. The method for forming a semiconductor device as claimed in claim 1, wherein the spacers comprise silicon oxide, silicon nitride and silicon oxynitride.

7. A method for forming a semiconductor device, comprising:
    providing a substrate, having a plurality of deep trench capacitors therein, wherein upper portions of the deep trench capacitor devices are revealed;
    forming spacers on sidewalls of the upper portions of the deep trench capacitors to form a predetermined region surrounded by the deep trench capacitor devices;
    etching the predetermined region of the substrate using the spacers and the upper portions of the deep trench capacitors as a mask to form a recess; and
    forming a recessed gate in the recess.

8. The method for forming a semiconductor device as claimed in claim 7, wherein the plurality of deep trench capacitors are four deep trench capacitors arranged in a matrix.

9. The method for forming a semiconductor device as claimed in claim 7, after forming a recessed gate in the recess further comprising:
    forming shallow trench isolations in the substrate to define an active area.

10. The method for forming a semiconductor device as claimed in claim 9, wherein the shallow trench isolations only cut four corners of the recess gate.

11. The method for forming a semiconductor device as claimed in claim 7, further comprising forming a word line electrically connecting the recess gate.

12. The method for forming a semiconductor device as claimed in claim 11, wherein a portion of the word line overlying the deep trench capacitors is wider than another portion overlying the recessed gate.

13. The method for forming a semiconductor device as claimed in claim 7, the step of providing a substrate, comprising at least two deep trench capacitor devices therein, wherein upper portions of the deep trench capacitor devices are revealed comprises:
    providing a substrate with a pad layer formed thereon;
    patterning the pad layer and the substrate to form at least two trenches;
    forming a deep trench capacitor device in each trench; and
    removing the pad layer until upper portions of the deep trench capacitor devices are revealed.

14. The method for forming a semiconductor device as claimed in claim 7, wherein the step of forming a recessed gate in the recess comprises:
    forming a gate dielectric layer within the recess;
    forming a layer of conductive material over the substrate; and
    polishing the layer of conductive material, the spacers, and the upper portions of the deep trench capacitors to form the recessed gate.

15. The method for forming a semiconductor device as claimed in claim 7, further comprising implanting the substrate to form a source region and a drain region on opposite sides of the recessed gate.

16. The method for forming a semiconductor device as claimed in claim 7, wherein the spacers comprise silicon oxide, silicon nitride and silicon oxynitride.

* * * * *